United States Patent [19]

Akram et al.

[11] Patent Number: 5,444,013
[45] Date of Patent: Aug. 22, 1995

[54] METHOD OF FORMING A CAPACITOR

[75] Inventors: Salman Akram, Boise, Id.; Charles Turner, Chandler, Ariz.; Alan Laulusa, Boise, Id.

[73] Assignee: Micron Technology, Inc., Boise, Id.

[21] Appl. No.: 333,262

[22] Filed: Nov. 2, 1994

[51] Int. Cl.$^6$ ........................................ H01L 21/8242
[52] U.S. Cl. ........................................ 437/60; 437/47; 437/49; 437/919; 437/52; 148/DIG. 14
[58] Field of Search .................... 437/60, 47, 48, 49, 437/52, 919; 148/DIG. 14

[56] References Cited

U.S. PATENT DOCUMENTS

| | | | |
|---|---|---|---|
| 4,978,634 | 12/1990 | Shen et al. | 437/52 |
| 5,118,383 | 6/1992 | Engelhardt | 437/52 |
| 5,191,509 | 3/1993 | Wen | 437/49 |
| 5,227,322 | 7/1993 | Ko et al. | 437/52 |
| 5,245,206 | 9/1993 | Chu et al. | 257/309 |
| 5,350,707 | 9/1994 | Ko et al. | 437/60 |
| 5,362,665 | 11/1994 | Lu | 437/52 |
| 5,384,152 | 1/1995 | Chu et al. | 437/52 |

OTHER PUBLICATIONS

Hirohito Watanabe, et al., "Device Application and Structure Observation for Hemispherical-Grained Silicon", Apr. 1, 1992, *J. Appl. Phys.* vol. 71 (7), pp. 3538–3543.
Hirohito Watanabe, et al., "Hemispherical Grain Silicon for High Density DRAMs", *Extended Abstracts of the 1992 International Conference on Solid State Devices and Materials, Tsukuba, 1992*, pp. 422–424, 5 total pages.
H. Watanabe, et al., "Hemispherical Graines Silicon (HSG-Si) Formation on In-Situ Phopsphorous Doped Amorphous-Si Using The Seeding Method", Undated, pp. PD3-PD3-3.

*Primary Examiner*—Brian E. Hearn
*Assistant Examiner*—Tuan Nguyen
*Attorney, Agent, or Firm*—Wells, St. John, Roberts, Gregory & Matkin

[57] ABSTRACT

A method of forming a capacitor includes, a) providing a substrate; b) etching into the substrate to provide a depression in the substrate, the depression having a sidewall which is angled from vertical; c) providing a conformal layer of hemispherical grain polysilicon within the depression and over the angled sidewall, the layer of hemispherical grain polysilicon less than completely filling the depression; and d) ion implanting the hemispherical grain polysilicon layer with a conductivity enhancing impurity. Preferred methods of providing the depression where the substrate comprises SiO$_2$ include a dry, plasma enhanced, anisotropic spacer etch utilizing reactant gases of CF$_4$ and CHF$_3$ provided to the substrate at a volumetric ratio of 1:1, and facet sputter etching.

28 Claims, 4 Drawing Sheets

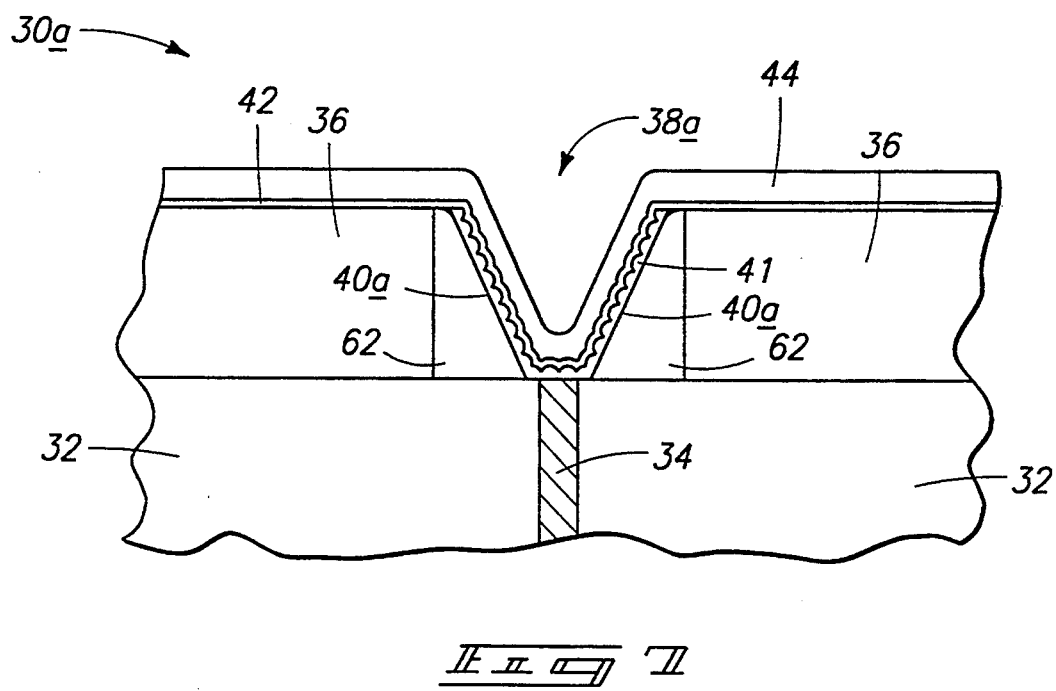

METHOD OF FORMING A CAPACITOR

TECHNICAL FIELD

This invention relates to methods of forming capacitors having storage node plates comprised of hemispherical grain (HSG) polysilicon.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the cell area. These include structures utilizing trench and stacked capacitors, as well as the utilization of new capacitor dielectric materials having higher dielectric constants.

One common material utilized for the capacitor plates is conductively doped polysilicon. Such material is so utilized because of its compatibility with subsequent high temperature processing, good thermal expansion properties with $SiO_2$, and its ability to be conformally deposited over widely varying typography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors used for the deposition.

The prior art has recognized that capacitance of a polysilicon layer can be increased merely by increasing the surface roughness of the polysilicon film that is used as a capacitor storage node. Such roughness is typically transferred to the cell dielectric and overlying polysilicon layer interfaces, resulting in a larger surface area for the same planar area which is available for the capacitor. One procedure utilized to achieve surface roughening involves deposition under conditions which are intended to inherently induce a rough or rugged upper polysilicon surface. Such include low pressure chemical vapor deposition (LPCVD) techniques. Yet, such techniques are inherently unpredictable or inconsistent in the production of a rugged polysilicon film.

One type of polysilicon film which maximizes outer surface area is hemispherical grain polysilicon. Such can be deposited or grown by a number of techniques. One technique includes direct LPCVD formation at 590° C. Another includes formation by first depositing an amorphous silicon film at 550° C. using He diluted $SiH_4$ (20%) gas at 1.0 Torr, followed by a subsequent high temperature transformation anneal. Hemispherical grain polysilicon is not, however, in situ doped during its deposition due to undesired reduction in grain size in the resultant film. Accordingly, methods must be utilized to conductively dope the hemispherical grain polysilicon after its deposition.

One such prior art technique and the drawbacks associated therewith is described with reference to FIG. 1. There illustrated is a wafer fragment 10 comprised of a bulk monocrystalline silicon substrate region 12 having a trench or capacitor container opening 14 provided therein. A thin layer 16 of in situ conductively doped polysilicon (not hemispherical grain) is provided over substrate 12 and within opening 14. Subsequently, a layer 18 of hemispherical grain polysilicon is deposited. During the course of subsequent wafer processing, inherent heating causes an anneal effect which drives conductivity enhancing dopant atoms from within layer 16 into layer 18 to render layer 18 electrically conductive. Alternately, a dedicated anneal step can be conducted.

The composite of layers 18 and 516 will ultimately be utilized as a lower capacitor storage plate in a finished capacitor construction. However even where layer 16 is excessively doped to accommodate for such out-diffusion, undesirable depletion effects develop in the resultant capacitor storage node, even after a dedicated anneal step. Such is exhibited or manifested as a drop in the net capacitance as the voltage is swept from zero volts in the negative direction.

One prior art alternate or additional technique for increasing dopant concentration in hemispherical grain layer 18 is by conducting angled ion implantation. Such is indicated by angled arrow pairs 20 and 22. Such represent separate ion implantation steps at opposing equal angles from vertical. Alternately instead of multiple different angled dopings, a constant angle can be utilized while the wafer is rotated. However, rotation during ion implantation can lead to considerable dopant non-uniformities and is typically less desirable than multiple angle implants. Regardless, the intent is to ion implant dopant atoms into layer 18 within trench 14. However, deep narrow contacts or trenches, such as illustrated trench 14, precludes adequate dopant implantation in the lower portions of the contact.

Accordingly, needs remain for providing improved capacitor constructions which minimizes or eliminates depletion effects, and which do not inherently require angled implanting.

BRIEF DESCRIPTION OF THE DRAWINGS

Preferred embodiments of the invention are described below with reference to the following accompanying drawings.

FIG. 7 is a view of the FIG. 5 wafer fragment at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with a preferred aspect of the invention, a method of forming a capacitor comprises the following steps:
  providing a substrate;
  etching into the substrate to provide a depression in the substrate, the depression having a sidewall which is angled from vertical;
  providing a conformal layer of hemispherical grain polysilicon within the depression and over the angled sidewall, the layer of hemispherical grain polysilicon less than completely filling the depression; and
  ion implanting the hemispherical grain polysilicon layer with a conductivity enhancing impurity.

Figure 1:
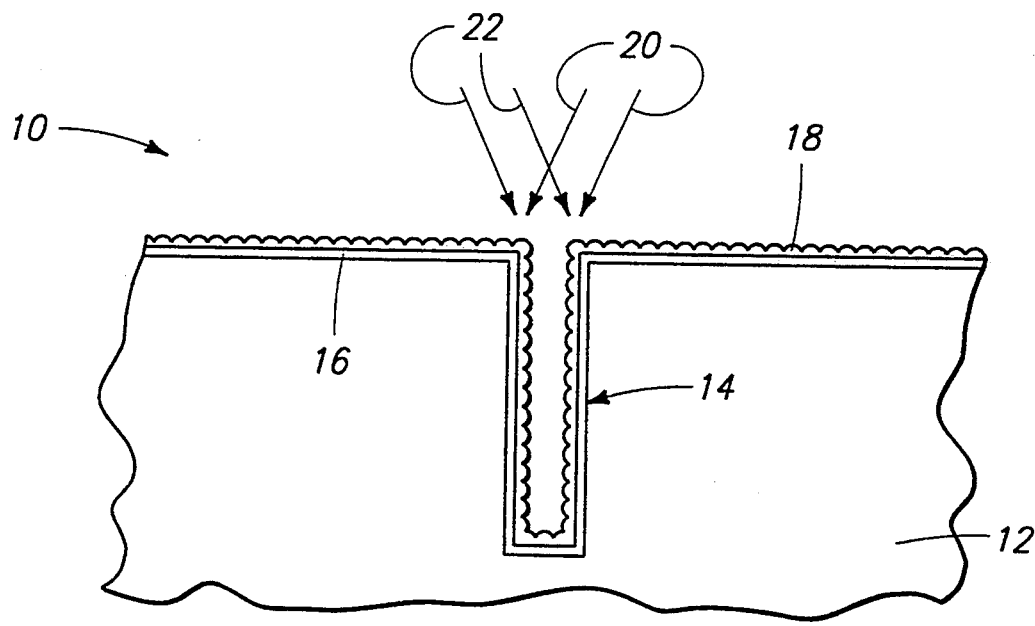
FIG. 1 is a diagrammatic representation of a wafer fragment processed according to prior art methods, and is discussed in the "Background" section above.
Figure 2:
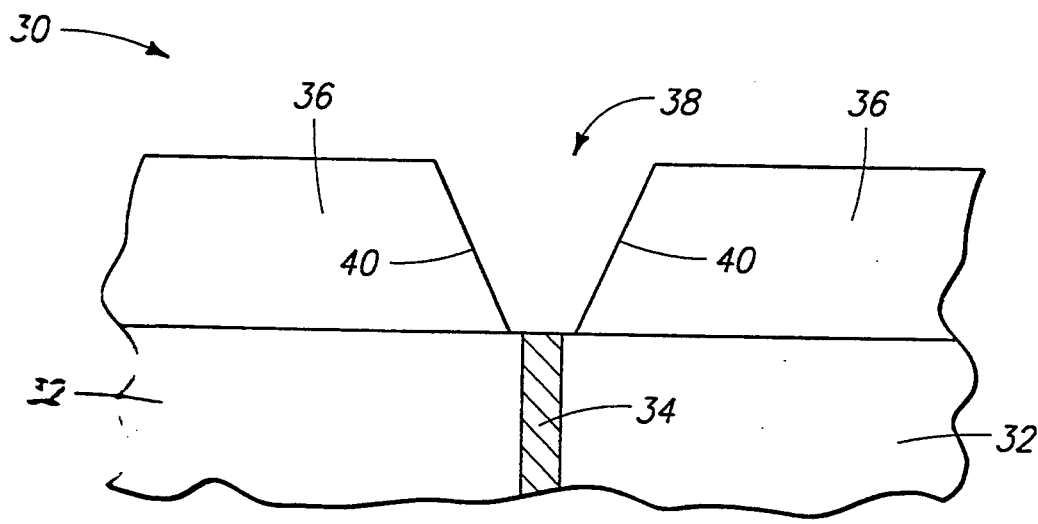
FIG. 2 is a diagrammatic view of a semiconductor wafer fragment processed in accordance with the invention.

More particularly and first with reference to FIG. 2, a semiconductor wafer fragment or substrate is indicated generally by reference numeral 30. Only pertinent portions thereof are shown for clarity. Wafer 30 comprises an insulating region 32 having an electrically conductive pillar 34 extending downwardly therethrough. The intent is to make a lower storage capacitor plate which electrically connects with conductive pillar 34. An outer insulating layer 36 is provided atop layer 32 and conductive pillar 34. Example and preferred materials include $SiO_2$, such as borophosphosilicate glass (BPSG), and $Si_3N_4$. This layer is patterned and etched into to provide a depression or contact opening 38 therewithin having sidewalls 40 which are angled from vertical. Example and preferred angling is from 10° to 40° from vertical, with from 20° to 40° from vertical being most preferred.

One preferred technique for achieving the illustrated etch where layer 36 is composed of $SiO_2$ comprises a dry anisotropic spacer etch, preferably plasma enhanced, utilizing reactant gases of $CF_4$ and $CHF_3$ provided to the wafer at a volumetric ratio of 1:1. Example conditions for a 6-liter etching reactor would be a temperature ranging from about 500° C. to about 700° C.; a pressure ranging from about 100 mTorr to about 200 mTorr; RF power provided at from 0 W–600 W to produce a magnetic field within the reactor of from 0–125 gauss; and equal gas flow rates of $CF_4$ and $CHF_3$ of 30 standard cubic centimeters per minute (sccm). Anisotropy in the etch is believed to be lost as. temperature falls much below 500° C. during etching.

An alternate preferred process for producing the FIG. 2 illustrated angled sidewalls 40 would be facet sputter etching. Example conditions would be to maintain a pressure of 30 mTorr; RF power of 350 W to produce a magnetic field of 60.0 gauss; and an argon flow of 50 sccm. Subjecting a wafer to such conditions for 105 seconds will produce approximately 550 Angstroms of depth in the etch.

The above described spacer etching will typically produce from 10° to 30° angling from vertical. The facet etching will typically produce from 20° to 40° angling from vertical. The perfectly straight, and therefore constant angling as shown in the figures is an ideal. More typically, the bottom and top corners of the depression 38 would be rounded and sidewalls 40 not exactly constantly angled between the upper surface of layer 36 and layer 32.

Figure 3:
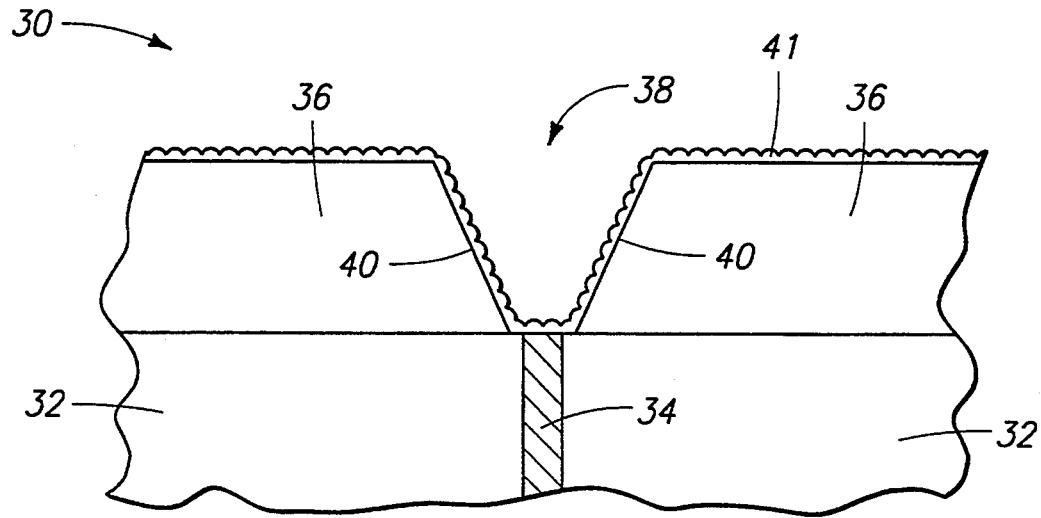
FIG. 3 is a view of the FIG. 2 wafer fragment at a processing step subsequent to that shown by FIG. 2.

Referring to FIG. 3, a conformal layer 41 of hemispherical grain polysilicon is provided within depression 38 and over angled sidewalls 40. Such is provided to a thickness which less than completely fills depression 38. An example preferred thickness for layer 41 is 500 Angstroms, where the maximum outer width of depression 38 is about 4000 Angstroms. An example technique for providing such a layer of hemispherical grain polysilicon would include an initial amorphous silicon deposition at 550° C. using He diluted $SiH_4$ (20%) at 1.0 Torr. This would be followed by an anneal step at $1 \times 10^{-7}$ Torr to $1 \times 10^{-8}$ Torr at 580° C. to 650° C. for from 1 minute to 10 minutes to transform the amorphous silicon into HSG polysilicon. An anneal could also be conducted in an $O_2$ atmosphere, or using a low concentration of another oxidizer, such as $N_2O$. Such can be utilized during HSG growth to further maximize surface area. Such conditions will most preferably create local areas on the surface of the hemispherical grain polysilicon that are oxygen rich (i.e., $SiO_x$) which further maximizes roughness. These areas will etch considerably faster than adjacent polysilicon during a subsequent HF dip dedicated to remove such $SiO_2$. The surrounding regions thereby result in a pitted surface and correspondingly increased capacitance.

Hemispherical grain polysilicon layer 41 is thereafter ion implanted with a conductivity enhancing impurity. Ion implantation is preferably conducted at a comparatively low energy dose of from 10 keV $-20$ keV using light ions to avoid excessive damage to the hemispherical grain layer 40. The ions should also preferably have a high diffusion coefficient to enable a more uniform redistribution of the dopant. Example dopant atoms include phosphorous and As. An example using phosphorus would be a voltage of 15 keV to provide an average implant depth of 239 Angstroms, and a standard implant deviation of 113 Angstroms. An example using As ions would be at 20 keV to provide an average implant depth of 194 Angstroms, having an implant standard deviation of 68 Angstroms. Preferred implant doses would be in the range of $5 \times 10^{15} - 5 \times 10^{16}$ ions/$cm^2$.

By far most preferred is that the hemispherical grain polysilicon layer be undoped prior to any ion implanting with a conductivity enhancing impurity. Further most preferred is that such ion implanting only be conducted only at a 0° angle relative to vertical, meaning that the implant be perpendicular relative to the general plane of the wafer. Such will overcome drawbacks associated with angled implanting and other ion implantings which require wafer rotation during implant. Such will essentially completely dope hemispherical grain layer 41 with impurity due to the angling of sidewalls 40 relative to vertical.

Subsequently, the film is annealed to electrically activate the implanted dopants thereby lowering the electrical resistivity of the capacitor plate. Example anneal conditions include exposure at 900° C. in an inert ambient for 30 minutes. Although not shown, an underlying rugged poly layer might also have previously been deposited prior to the deposition of the hemispherical grain polysilicon.

Figure 4:
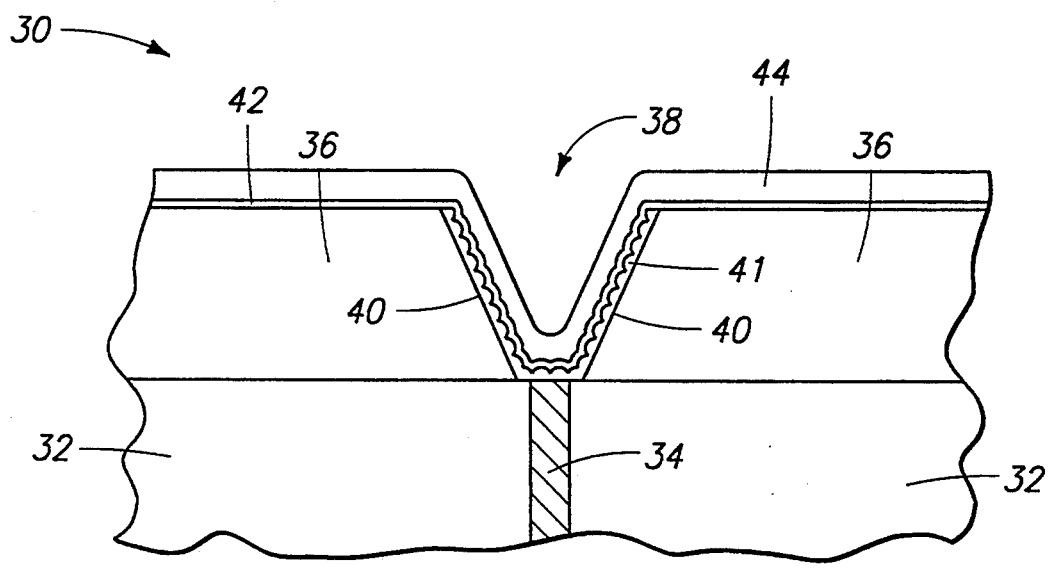
FIG. 4 is a view of the FIG. 2 wafer fragment at a processing step subsequent to that shown by FIG. 3.

Referring to FIG. 4, the wafer is subjected to chemical mechanical polishing to remove the material of layer 41 from layer 36 outside of depression 38. Thereafter, a capacitor dielectric layer 42, such as ONO, is provided. Subsequently, a cell polysilicon layer 44 is deposited to complete the capacitor construction.

Figure 5:
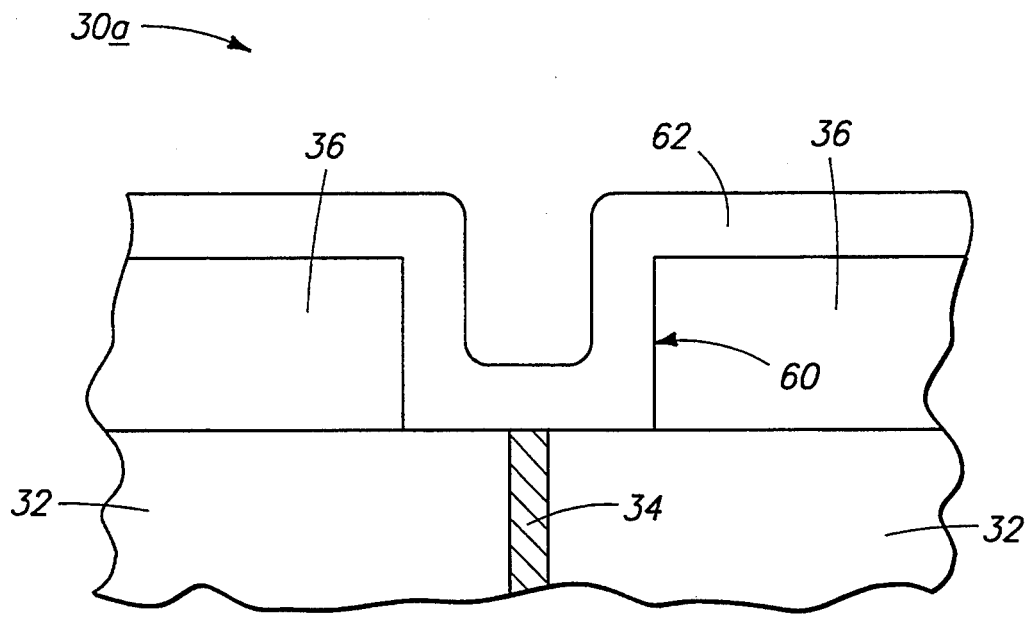
FIG. 5 is a diagrammatic view of an alternate semiconductor wafer fragment processed in accordance with an alternate aspect of the invention.

An alternate embodiment preferred method in accordance with the invention is described with reference to FIGS. 5–7. Like numbers from the FIGS. 2–4 embodiment have been utilized where appropriate, with the suffix "a" being used to designate differences. FIG. 5 illustrates an alternate substrate 30a provided with a contact opening 60 in layer 36. A layer 62 of conductively doped polysilicon is provided as shown to less than completely fill opening 60.

Figure 6:
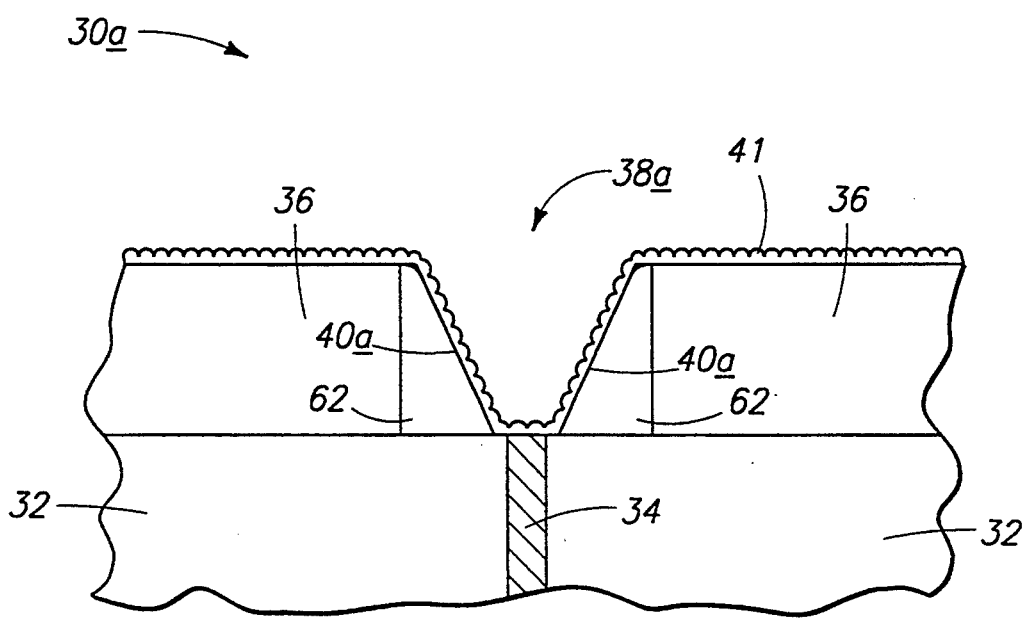
FIG. 6 is a view of the FIG. 5 wafer fragment at a processing step subsequent to that shown by FIG. 5.

Referring to FIG. 6, layer 62 is subjected to suitable etching to provide a depression or contact opening 38a therewithin having sidewalls 40a which are angled from vertical. Example and preferred techniques include anisotropic spacer etching and facet sputter etching. Example conditions for an anisotropic spacer etch include utilizing gases containing a Cl species, such as $Cl_2$ or $CCl_3$. Reactor conditions would include a temperature range from about 400° C. to 700° C., a pressure range from 100 mTorr to 1 Torr; and RF power from 0 to 800 Watts. Example conditions for facet sputtering would be the same as those described above with the first described embodiment.

Referring to FIG. 7, the construction is completed to be analogous to that shown by FIG. 4. This alternate embodiment provides the added advantage of the lower capacitor storage node plate being thicker than in the first described embodiment, comprising both HSG layer 41 and remaining layer 62.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising the following steps:
   providing a substrate;
   etching into the substrate to provide a depression in the substrate, the depression having a sidewall which is angled from vertical;
   providing a conformal layer of hemispherical grain polysilicon within the depression and over the angled sidewall, the layer of hemispherical grain polysilicon less than completely filling the depression; and
   ion implanting the hemispherical grain polysilicon layer with a conductivity enhancing impurity.

2. The capacitor forming method of claim 1 wherein the step of etching is conducted to produce a depression sidewall angle from vertical of from 10° to 40°.

3. The capacitor forming method of claim 1 wherein the substrate comprises an outer insulating layer selected from the group consisting of $SiO_2$, $Si_3N_4$ and BPSG.

4. The capacitor forming method of claim 1 wherein the substrate comprises an outer insulating layer, and the step of etching comprises facet sputter etching.

5. The capacitor forming method of claim 1 wherein the substrate comprises an outer insulating layer, and the step of etching comprises a dry anisotropic spacer etch.

6. The capacitor forming method of claim 1 wherein the substrate comprises an outer layer of polysilicon, and the step of etching comprises facet sputter etching.

7. The capacitor forming method of claim 1 wherein the substrate comprises an outer layer of polysilicon, and the step of etching comprises a dry anisotropic spacer etch.

8. The capacitor forming method of claim 1 wherein the substrate comprises $SiO_2$, and the step of etching comprises a dry anisotropic spacer etch utilizing reactant gases of $CF_4$ and $CHF_3$ provided to the substrate at a volumetric ratio of 1:1.

9. The capacitor forming method of claim 1 wherein the substrate comprises $SiO_2$, and the step of etching comprises a dry, plasma enhanced, anisotropic spacer etch utilizing reactant gases of $CF_4$ and $CHF_3$ provided to the substrate at a volumetric ratio of 1:1.

10. The capacitor forming method of claim 1 wherein the step of etching comprises facet sputter etching.

11. The capacitor forming method of claim 1 wherein the hemispherical grain polysilicon is provided undoped prior to any ion implanting with a conductivity enhancing impurity.

12. The capacitor forming method of claim 1 wherein the ion implanting is conducted at a voltage ranging from 10 keV to 20 keV.

13. The capacitor forming method of claim 1 wherein the substrate comprises an outer insulating layer comprising $SiO_2$, and the step of etching comprises a dry anisotropic spacer etch utilizing reactant gases of $CF_4$ and $CHF_3$ provided to the substrate at a volumetric ratio of 1:1, and the etching step is conducted to produce a depression sidewall angle from vertical of from 10° to 40°.

14. The capacitor forming method of claim 1 wherein the step of etching comprises facet sputter etching to produce a depression sidewall angle from vertical of from 20° to 40°.

15. A method of forming a capacitor comprising the following steps:
   providing a substrate;
   etching into the substrate to provide a depression in the substrate, the depression having a sidewall which is angled from vertical;
   providing a conformal layer of hemispherical grain polysilicon within the depression and over the angled sidewall, the layer of hemispherical grain polysilicon less than completely filling the depression; and
   ion implanting the hemispherical grain polysilicon layer with a conductivity enhancing impurity, the ion implanting with the conductivity enhancing impurity being conducted only at a 0° angle relative to vertical.

16. The capacitor forming method of claim 15 wherein the step of etching is conducted to produce a depression sidewall angle from vertical of from 10° to 40°.

17. The capacitor forming method of claim 15 wherein the substrate comprises an outer insulating layer, and the step of etching comprises facet sputter etching.

18. The capacitor forming method of claim 15 wherein the substrate comprises an outer insulating layer, and the step of etching comprises a dry anisotropic spacer etch.

19. The capacitor forming method of claim 15 wherein the substrate comprises an outer layer of polysilicon, and the step of etching comprises facet sputter etching.

20. The capacitor forming method of claim 15 wherein the substrate comprises an outer layer of polysilicon, and the step of etching comprises a dry anisotropic spacer etch.

21. The capacitor forming method of claim 15 wherein the substrate comprises $SiO_2$, and the step of etching comprises a dry anisotropic spacer etch utilizing reactant gases of $CF_4$ and $CHF_3$ provided to the substrate at a volumetric ratio of 1:1.

22. The capacitor forming method of claim 15 wherein the substrate comprises $SiO_2$, and the step of etching comprises a dry, plasma enhanced, anisotropic spacer etch utilizing reactant gases of $CF_4$ and $CHF_3$ provided to the substrate at a volumetric ratio of 1:1.

23. The capacitor forming method of claim 15 wherein the step of etching comprises facet sputter etching.

24. The capacitor forming method of claim 15 wherein the substrate comprises $SiO_2$, and the step of etching comprises facet sputter etching.

25. The capacitor forming method of claim 15 wherein the hemispherical grain polysilicon is provided undoped prior to any ion implanting with a conductivity enhancing impurity.

26. The capacitor forming method of claim 15 wherein the ion implanting is conducted at a voltage ranging from 10 keV to 20 keV. lo 27. The capacitor forming method of claim 15 wherein the substrate comprises $SiO_2$, and the step of etching comprises a dry anisotropic spacer etch utilizing reactant gases of $CF_4$ and $CHF_3$ provided to the substrate at a volumetric ratio of 1:1, and the etching step is conducted to produce a depression sidewall angle from vertical of from 10° to 40°.

28. The capacitor forming method of claim 15 wherein the step of etching comprises facet sputter etching to produce a depression sidewall angle from vertical of from 20° to 40°.

* * * * *